United States Patent
Shih et al.

(10) Patent No.: US 10,822,689 B2
(45) Date of Patent: Nov. 3, 2020

(54) PATTERNING OF NANOPOROUS GOLD MICROSTRUCTURES

(71) Applicant: University of Houston System, Houston, TX (US)

(72) Inventors: Wei-Chuan Shih, Houston, TX (US); Fusheng Zhao, Houston, TX (US); Jingting Li, Houston, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 0 days.

(21) Appl. No.: 16/333,695

(22) PCT Filed: Sep. 15, 2017

(86) PCT No.: PCT/US2017/051801
§ 371 (c)(1),
(2) Date: Mar. 15, 2019

(87) PCT Pub. No.: WO2018/053278
PCT Pub. Date: Mar. 22, 2018

(65) Prior Publication Data
US 2020/0017954 A1  Jan. 16, 2020

Related U.S. Application Data

(60) Provisional application No. 62/394,842, filed on Sep. 15, 2016.

(51) Int. Cl.
| C23C 14/34 | (2006.01) |
| C23C 14/56 | (2006.01) |
| C23C 14/58 | (2006.01) |
| B82Y 40/00 | (2011.01) |

(52) U.S. Cl.
CPC .............. *C23C 14/34* (2013.01); *C23C 14/56* (2013.01); *C23C 14/586* (2013.01); *C23C 14/5813* (2013.01); *B82Y 40/00* (2013.01)

(58) Field of Classification Search
CPC ..... C23C 14/34; C23C 14/56; C23C 14/5813; C23C 14/586
See application file for complete search history.

(56) References Cited

U.S. PATENT DOCUMENTS

| 7,450,227 | B2 * | 11/2008 | Dwight | ................. B82Y 30/00 356/300 |
| 8,902,421 | B2 * | 12/2014 | Shih | ...................... G01J 3/0229 356/301 |
| 2012/0077057 | A1 | 3/2012 | Kysar et al. | |
| 2013/0182249 | A1 | 7/2013 | Weiss et al. | |
| 2013/0245416 | A1 * | 9/2013 | Yarmush | ................. H01B 7/30 600/396 |

FOREIGN PATENT DOCUMENTS

| JP | 2008-184671 A | 8/2008 |
| WO | 2015061250 A2 | 4/2015 |

OTHER PUBLICATIONS

International Search Report and Written Opinion dated Dec. 19, 2017 for corresponding International Application No. PCT/US2017/051801.
Wang, Dong, et al; Complex patterned gold structures fabricated via laser annealing and dealloying, Applied Surface Science, May 30, 2014, vol. 302, p. 74-78, ISSN:0169-4332.
Li, Jingting, et al; Laser-assisted dealloying for direct-write patterning of plasmonic nanostructures, Proceedings of SPIE., Feb. 2017, vol. 10115, 101150K, doi:10.1117/12.2253083.

\* cited by examiner

*Primary Examiner* — Michael P Wieczorek
(74) *Attorney, Agent, or Firm* — Jackson Walker LLP

(57) ABSTRACT

A nanoporous metal can be formed by projecting laser patterns using a spatial light modulator (SLM) onto a gold/silver alloy film immersed in diluted nitric acid solutions. Heat accumulation induced by the photothermal effect enables localized dealloying in dilute nitric acid. NPG micropatterns can be formed at the irradiated spots while the surrounding alloy remains intact.

17 Claims, 9 Drawing Sheets

$D_{5s} = (-10.85\ln(3.17/p))^{1/2}$ $D_{10s} = (-16.44\ln(2.84/p))^{1/2}$ $D_{15s} = (-21.29\ln(2.78/p))^{1/2}$ $D_{20s} = (-21.73\ln(2.71/p))^{1/2}$

PATTERNING OF NANOPOROUS GOLD MICROSTRUCTURES

RELATED APPLICATIONS

This application is the National Stage of International Application No. PCT/US2017/051801, filed Sep. 15, 2017; which claims priority to U.S. Provisional Patent Application No. 62/394,842 filed on Sep. 15, 2016 which are specifically incorporated by reference in their entirety herein.

GOVERNMENT FUNDING

This invention was made with government support under grant CBET-1151154 awarded by the National Science Foundation and grant NNX12AQ44G awarded by the National Aeronautics and Space Administration. The government has certain rights in the invention.

FIELD

The disclosure relates generally to preparation of nanoporous gold. The disclosure relates specifically to a dealloying method to produce nanoporous gold.

BACKGROUND

Porous materials are of great importance in many fundamental studies as well as technological applications. Among numerous porous materials, nanoporous gold (NPG) has attracted significant interest due to its unique properties such as high surface area to volume ratio, continuous porous nanostructure, high electrical conductivity and thiol-gold surface chemistry. Potential applications can be found in biosensing [1-3], catalysis [4, 5], and energy storage. NPG microstructures feature large surface area, light-excited surface plasmon resonance, and photothermal properties. They have been shown to be effective biosensors by detecting surface bound molecules by various spectroscopic techniques (extinction, scattering, Raman, fluorescence), bioelectrodes by voltammetry and impedance measurements. They have also been employed as photothermal converters for remote/localized heating, heat-induced delivery of molecules, and killing of pathogens. NPG can be produced by either dealloying or electrochemical corrosion of a gold alloy. Dealloying is a simple method where the less noble constituent of an alloy is selectively removed in a strong corrosive solution, e.g., concentrated nitric acid, while the more noble constituent forms an open porous network with bicontinuous pore and ligament structures. However, there is little control over the free corrosion process during dealloying. The desire to utilize NPG in various applications as well as fundamental studies motivate the development of novel fabrication and synthesis techniques since NPG properties are modified by morphological controls of the porous structures [6, 7].

Beyond the fabrication of semi-finite NPG thin films, a few recent studies employed post-dealloying modifications to generate hierarchical NPG structures. L. Zhang et al. employed thermally induced wrinkling in NPG film to produce ultrahigh surface-enhanced Raman scattering (SERS) for molecular detection [8]. Y. Jiao et al. used direct mechanical impress to generate grating patterns with a few hundred of nanometers characteristic pitch [9]. These existing fabrication methods define the longer range modulation after dealloying, thus can be classified as post-dealloying patterning.

A novel fabrication approach for sub-micron NPG disks was developed by the combination of pre-dealloying lithographic patterning followed by dealloying [10]. The large surface area and hot-spots inside the nanoporous structures have contributed to an average SERS enhancement factor exceeding $10^8$ and high photothermal conversion efficiency (>50%) [3, 11]. In addition to size engineering, the plasmonic properties of NPG disks have been tuned by annealing, rapid laser photothermal annealing [12] and surface modifications [13]. NPG disk substrates have been employed for biomolecular sensing in a novel stamping approach, in microfluidic devices, different detection mechanisms, and for anti-bacterial applications [14, 15]. More recently, an in situ NPG micropatterning method by geometrical constraints to form hierarchical NPG structures during dealloying was reported [16].

The previous patterning technique for NPG is based on colloidal nanosphere lithography or electron-beam lithography which are costly and not flexible in terms of generating arbitrary shape NPG structures. Existing technologies for preparing NPG microstructures are limited to planar substrates such as silicon wafers and glass slides.

SUMMARY

An embodiment of the disclosure is a method for forming a nanoporous metal, comprising providing a glass substrate; evaporating chromium and gold onto the glass substrate; sputtering a layer of a noble metal alloy on the adhesion layer to form a sample; immersing the sample in an acid solution; placing the sample in the acid solution on a microscope; and irradiating a projected laser pattern on the alloy layer. In an embodiment, the irradiating occurs for 5 seconds to 20 seconds. In an embodiment, the method further comprises performing a phase modulation and producing a desired pattern using a continuous wave laser beam incident on a spatial light modulator, wherein a modulated beam is fed through a back port of an inverted microscope to form a projected laser pattern. In an embodiment, the noble metal alloy is comprised of gold and silver. In an embodiment, the acid in the acid solution is nitric acid. In an embodiment, the concentration of the acid solution is equal to or less than 3.65 M. In an embodiment, the thickness of the chromium layer is 2-5 nm. In an embodiment, the thickness of the gold adhesion layer is 5-50 nm. In an embodiment, the thickness of the alloy layer is 20-100 nm. In an embodiment, the substrate is made from one selected from the group consisting of glass, plastics, optical fiber, and a combination thereof. In an embodiment, the substrate is selected from the group consisting of curved, microscopic, non-rigid, and a combination thereof. In an embodiment, the substrate is selected from the group consisting of medical catheter, medical implants, capillary tubes, and contact lenses. In an embodiment, the nanoporous metal is a nanoporous gold microstructure. In an embodiment, the nanoporous metal is utilized in a microfluidic device. In an embodiment, the microfluidic device is a biosensor or photothermal activators. In an embodiment, the nanoporous gold microstructure occurs after a bonding step of the microfluidic device.

An embodiment of the disclosure is a device for forming a nanoporous metal, comprising a laser light source; a beam expander, wherein the beam expander expands light from the laser light source to an expanded beam and the expanded beam is incident on the SLM; a spatial light modulator (SLM), wherein the SLM modulates the beam by performing phase modulation and producing a desired pattern, wherein a modulated beam is fed through the back port of the inverted microscope to irradiate an alloy sample; and an inverted microscope. In an embodiment, the alloy sample is a layer of a noble metal alloy which lies on a glass substrate covered with chromium and gold, and the alloy sample is immersed in an acid solution. In an embodiment, the nanoporous metal is a nanoporous gold microstructure.

The foregoing has outlined rather broadly the features of the present disclosure in order that the detailed description that follows may be better understood. Additional features and advantages of the disclosure will be described hereinafter, which form the subject of the claims.

BRIEF DESCRIPTION OF THE DRAWINGS

In order that the manner in which the above-recited and other enhancements and objects of the disclosure are obtained, a more particular description of the disclosure briefly described above will be rendered by reference to specific embodiments thereof which are illustrated in the appended drawings. Understanding that these drawings depict only typical embodiments of the disclosure and are therefore not to be considered limiting of its scope, the disclosure will be described with additional specificity and detail through the use of the accompanying drawings in which:

FIG. 1a depicts a SEM image of an NPG spot. The defined edge of the spot is indicated by a red circle;

FIG. 1b depicts a zoom in image at the center of the spot of FIG. 1a;

DETAILED DESCRIPTION

Figures 1A, 1B:
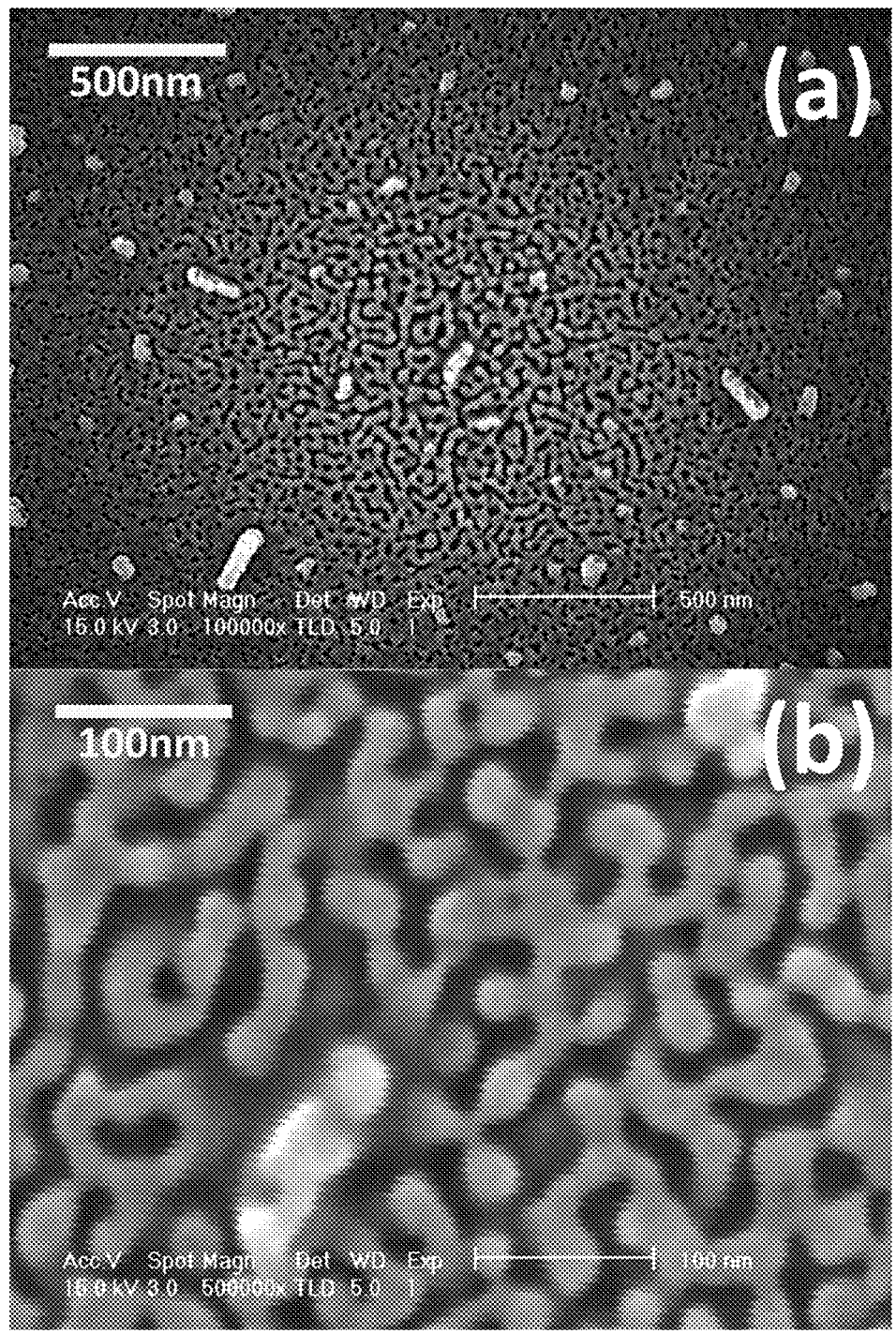

The particulars shown herein are by way of example and for purposes of illustrative discussion of the preferred embodiments of the present disclosure only and are presented in the cause of providing what is believed to be the most useful and readily understood description of the principles and conceptual aspects of various embodiments of the disclosure. In this regard, no attempt is made to show structural details of the disclosure in more detail than is necessary for the fundamental understanding of the disclosure, the description taken with the drawings making apparent to those skilled in the art how the several forms of the disclosure may be embodied in practice.

The following definitions and explanations are meant and intended to be controlling in any future construction unless clearly and unambiguously modified in the following examples or when application of the meaning renders any construction meaningless or essentially meaningless. In cases where the construction of the term would render it meaningless or essentially meaningless, the definition should be taken from Webster's Dictionary $3^{rd}$ Edition.

Disclosed is a novel patterning technique to direct-write nanoporous gold (NPG) into micron-sized units by projecting laser patterns using a spatial light modulator (SLM) onto a gold/silver alloy film immersed in diluted nitric acid solutions. Heat accumulation induced by the photothermal effect enables localized dealloying in dilute nitric acid solution, which is otherwise impotent at room temperature. Consequently, NPG micropatterns were formed at the irradiated spots while the surrounding alloy remained intact. The size of the patterned NPG microstructures has been studied with respect to laser power and irradiation time. The NPG microstructures become significantly more transparent compared to the original alloy film. The NPG microstructures also exhibit strong localized surface plasmon resonance (LSPR) which is otherwise weak in the original alloy film. Both the light transmission intensity and LSPR peak wavelength have been demonstrated to be sensitive to the local environmental refractive index as quantified by microscopy and spectroscopy. This patterning method provides the flexibility to pattern NPG microstructures as including but not limited to optical/electrical biosensors or photothermal activators on unconventional substrates (including but not limited to curved, microscopic, and non-rigid substrates) where planar lithography does not work. An example of embodiments of unconventional substrates are optical fibers, medical catheter/implants, capillary tubes, and contact lenses.

An embodiment of the disclosure provides the flexibility to pattern NPG microstructures as biosensor or photothermal activators inside microdevices such as microfluidics. Traditionally, the NPG microstructures have to be made before the microfluidic channel is constructed. However, the NPG surface properties can be altered or deteriorated during the bonding step of microfluidic channel typically made of polydimethylsiloxane (PDMS), plastics, or glass. This method allows the bonding step to take place before the formation of NPG microstructures, thus preventing any surface deterioration.

A NPG micropatterning method utilizing localized laser heating is provided. In this method, dealloying occurs at the laser focal spots due to elevated temperature. It is known that the dealloying rate increases with rising temperature and decreases with lowering acid concentration [17, 18]. Therefore, dealloying can occur at an elevated temperature even in diluted acid which otherwise has negligible dealloying effects at room temperature. However, simply raising the temperature does not provide spatial selectivity to form NPG micropatterns unless the heating can be localized. Laser-induced photothermal effect is employed for localized heating. Using a spatial light modulator (SLM), nearly arbitrary micropatterns can be designed and employed. The noncontact nature of this technique is well suited for the processing of substrates immersed in an aqueous environment. Further, this technique shares the same advantages as maskless laser direct writing which has found numerous applications [19, 20].

In the patterning technique for making nanoporous gold microstructures by generating localized laser heating in diluted nitric acid to selectively dealloy the heated locations, the combination of the heating effect of focused laser and beam patterning via the SLM enables the dealloying process and the patterning process to occur concurrently. Thus generated NPG microstructures show gradual changes in pore size and pore connectivity within and around the irradiated area. Parameters including laser power and irradiation duration were investigated with the resulting nanostructures, where the plasmonics effect presents an increasing influence on the material's photothermal light harvesting efficiency as the dealloying proceeds. The patterned NPG microstructures exhibit diameter-dependent red-shift in their extinction spectra. They also exhibit spectral and intensity sensitivity to the local refractive index.

Example 1

Dealloying model. The dealloying process can be described by the model of the concurrent dissolution of the less noble metal Ag and the diffusion of the more noble metal Au [21]. The steady state dissolution rate can be described with $k_{dis} = v_{dis} \exp(-(nE_b - \phi)/k_B T)$, where $v_{dis}$ is a prefactor, $E_b$ is the total bond energy for an atom with n neighbors, and $\phi$ is the free corrosion potential. While Ag is being removed, the diffusion of Au atoms results in the formation of nanopores whose pore size as a function of time can be approximated by $d(t)^4 = K t D_s$, where diffusivity $D_s = D_0 \exp(-E_a/k_B T)$, $E_a$ is the activation energy, and K and $D_0$ are constants [16]. The dealloying front velocity depends exponentially on the Ag/Au atomic ratio and acid concentration for a given temperature [22]. For a given alloy composition, the reaction rate is lowered by reducing the acid concentration, but can be increased by elevating the temperature. The resulting pore distribution and pore size are therefore functions of both the temperature and time.

In an embodiment, the less noble metal is ruthenium, rhodium, palladium, silver, osmium, iridium, platinum, gold, mercury, rhenium, and copper and the more noble metal is ruthenium, rhodium, palladium, silver, osmium, iridium, platinum, gold, mercury, rhenium, and copper.

In an embodiment, the less noble metal is silver and the more noble metal is gold.

In an embodiment, the acid is nitric acid, hydrochloric acid, sulfuric acid, hydrobromic acid, hydroiodic acid, perchloric acid, hydrofluoric acid or a mixture of at least two thereof.

In an embodiment, the acid is nitric acid.

In an embodiment, the acid concentration is equal to or lower than 3.65M.

In an embodiment, the atomic ratio of the more noble metal to the less noble metal is 28:72.

In an embodiment, the pore size ranges from 0 to 50 nm.

In an embodiment, the time ranges from 5 to 20 seconds.

In an embodiment, the irradiation was at a range of 2 mW to 5.6 mW.

Example 2

In an embodiment, the experimental setup consists of a 532 nm continuous wave (CW) laser (Spectra Physics Millennia Xs) with its beam expanded to ~7 mm in diameter. The expanded beam was incident on an SLM (Boulder Nonlinear XY Phase Series) which performs phase modulation and produces the desired pattern. The modulated beam was then fed through the back port of an inverted microscope (Olympus IX70) to irradiate the alloy sample. The full-width half maximum (FWHM) of a single laser spot was 1.5 µm on the sample with projecting precision error less than 200 nm. The holograms for phase modulation were pre-calculated and loaded into the SLM using the Gerchberg-Saxton algorithm [23]. A camera (Thorlabs DCC 1545M) was mounted at the front port of the microscope to record transmission bright-field images using a top tungsten halogen lamp. Alternatively, the transmitted light exited via the side port was directed toward a spectrograph (Acton 2300) and a charge-coupled device (CCD) camera (PIXIS 400BR). In an embodiment, this system can be used for parallel hyperspectral high-speed Raman microscopy [24, 25].

In an embodiment, a typical sample was prepared by evaporating 5 nm chromium (Cr) and 50 nm Au onto a glass substrate, followed by sputtering of a 90 nm thick $Au_{28}Ag_{72}$ (atomic percentage) alloy layer. The as-prepared samples were immersed in 100 µL 20 wt. % $HNO_3$ solution on a coverslip placed at the sample plane of the microscope where the projected laser pattern irradiated on the alloy film. After patterning, the samples were thoroughly rinsed with DI water and dried.

In an embodiment, 2-5 nm chromium is evaporated onto a glass substrate. In an embodiment, 5-50 nm of Au is evaporated onto a glass substrate.

Example 3

To establish the proof-of-concept of our approach, as prepared Au/Ag alloy films were immersed in 3.65 M $HNO_3$ solution at different temperatures ranging from room temperature 22° C. to 80° C. No perceivable change was observed from the room temperature sample after more than 10 minutes. In contrast, dealloying occurred within 10 sec when the acid temperature was 80° C.

Figures 1C, 1D:
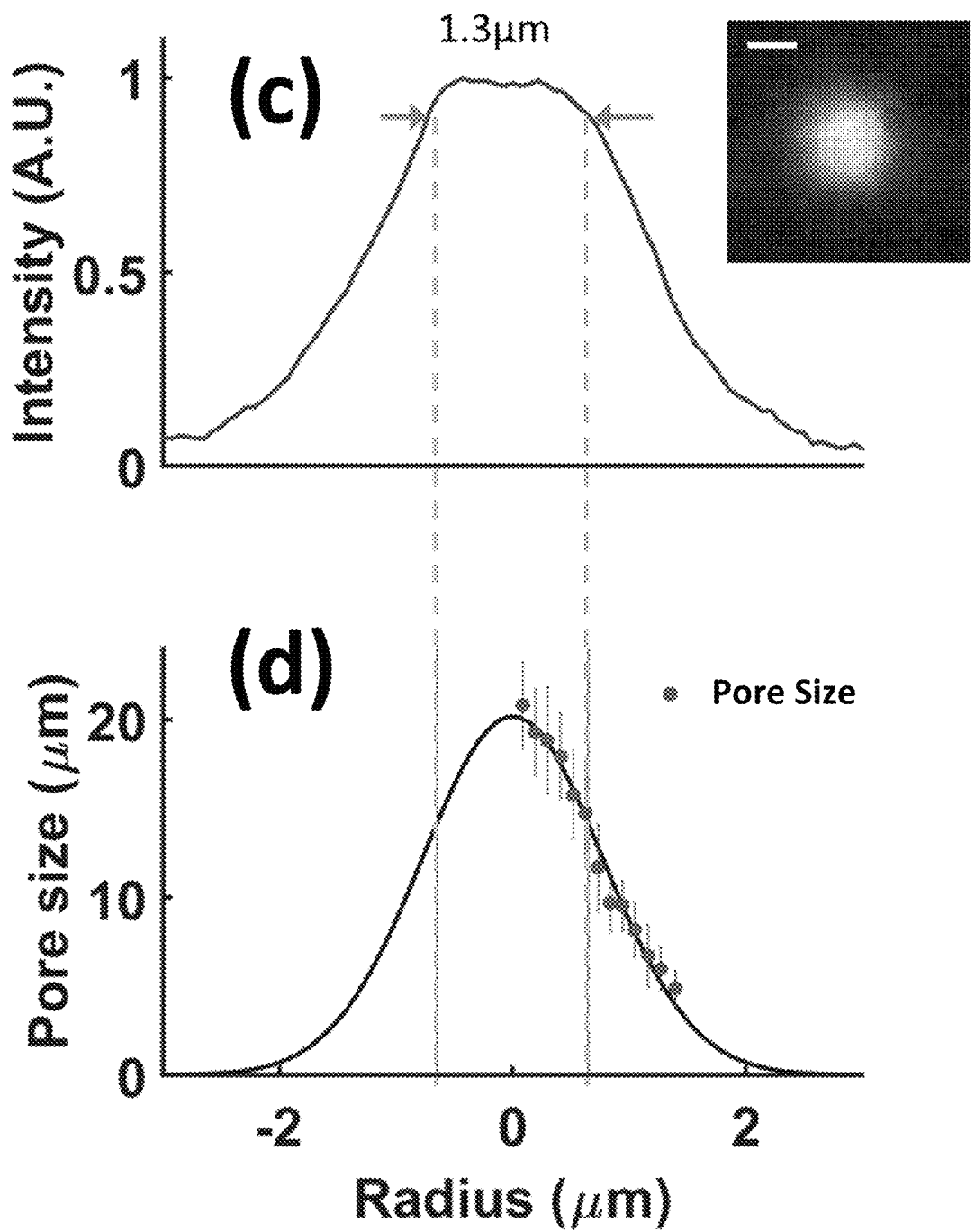
FIG. 1c depicts a cross-sectional view of the bright-field image, inset: bright-field image, scale bar is 2 μm.
FIG. 1d depicts pore size statistics and a Gaussian fit of the image.
Figures 1E, 1F, 1G, 1H:
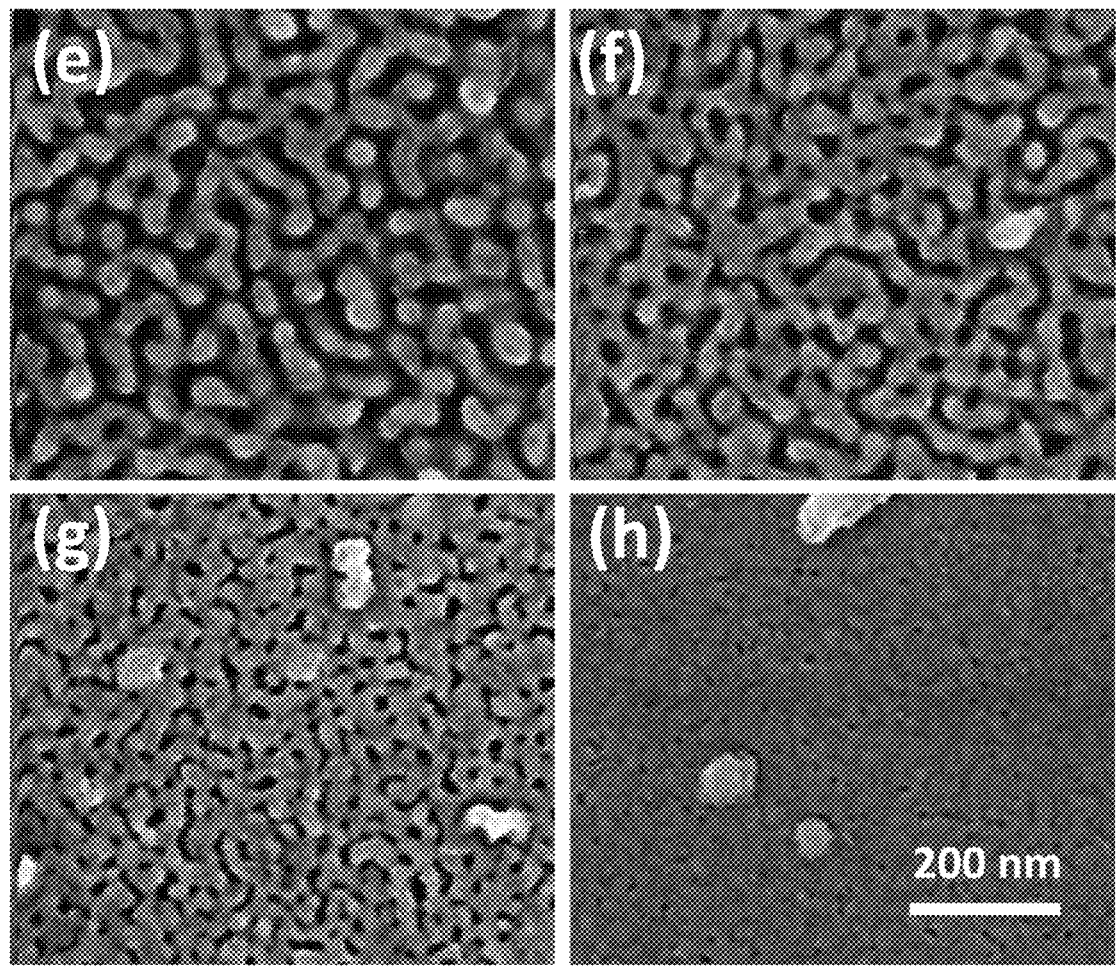
FIGS. 1e-1h depicts SEM images of different locations on sample from close to far away from the irradiated center.

When the laser was focused on the alloy thin film, a round spot NPG microstructure was formed. The spot generated by irradiation of 3.2 mW for 10 s is shown in the scanning electron microscopy (SEM) image in FIG. 1a. At the center of the spot, as shown in FIG. 1b, the pore size is 21±2 nm and the surface pore coverage is around 50%. The porous structure transitioned gradually from the center to the outer edge. The bright-field image (FIG. 1c inset) and its normalized cross-sectional intensity profile (FIG. 1c) show a distinct plateau over a 1.3 µm diameter with light transmission intensity larger than 90% of the maximum intensity. The contour of this area is circled in FIG. 1a, where the diameter of the NPG microstructure is defined as the width of the region with >90% intensity in light transmission. The pore size statistics from the NPG spot in FIG. 1a and a fitted Gaussian curve of mean µ=0 indicating the center and standard deviation or σ=1.1 are shown in FIG. 1d, where random pore measurements were taken from each of 13 different radii from the center. Within the diameter threshold, the mean pore size ranges from 14 to 22 nm, while outside the diameter threshold, the mean pore size drops to the range from 5 to 11 nm. The light-transmission imaging was then used to evaluate in situ dealloying results in future experiments. FIG. 1e-h show SEM images of representative nanoporous structures from the center of the NPG microstructure to the surrounding alloy region. A gradual evolution has been observed that the pore size and connectivity decrease while the ligament size and connectivity increased at a farther distance away from the laser irradiation center.

Figure 2A:
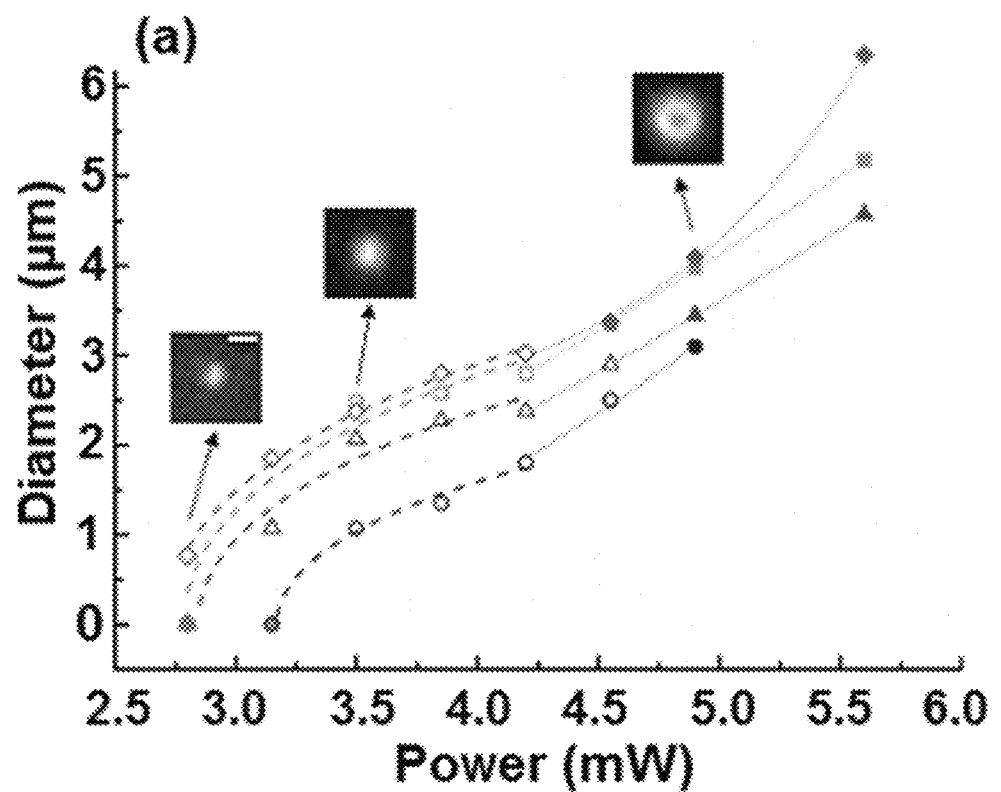
FIG. 2a depicts different outcomes depending on the laser power and irradiation time of each spot. Gray markers indicate no dealloying, empty markers indicate bicontinuous pores and ligaments, and solid markers indicate non-continuous structure at the center. Insets are bright-field images of NPG spots exposed for 20 s with 2.8, 3.5, and 4.9 mW, scale bar 2 μm.
Figures 2B, 2C:
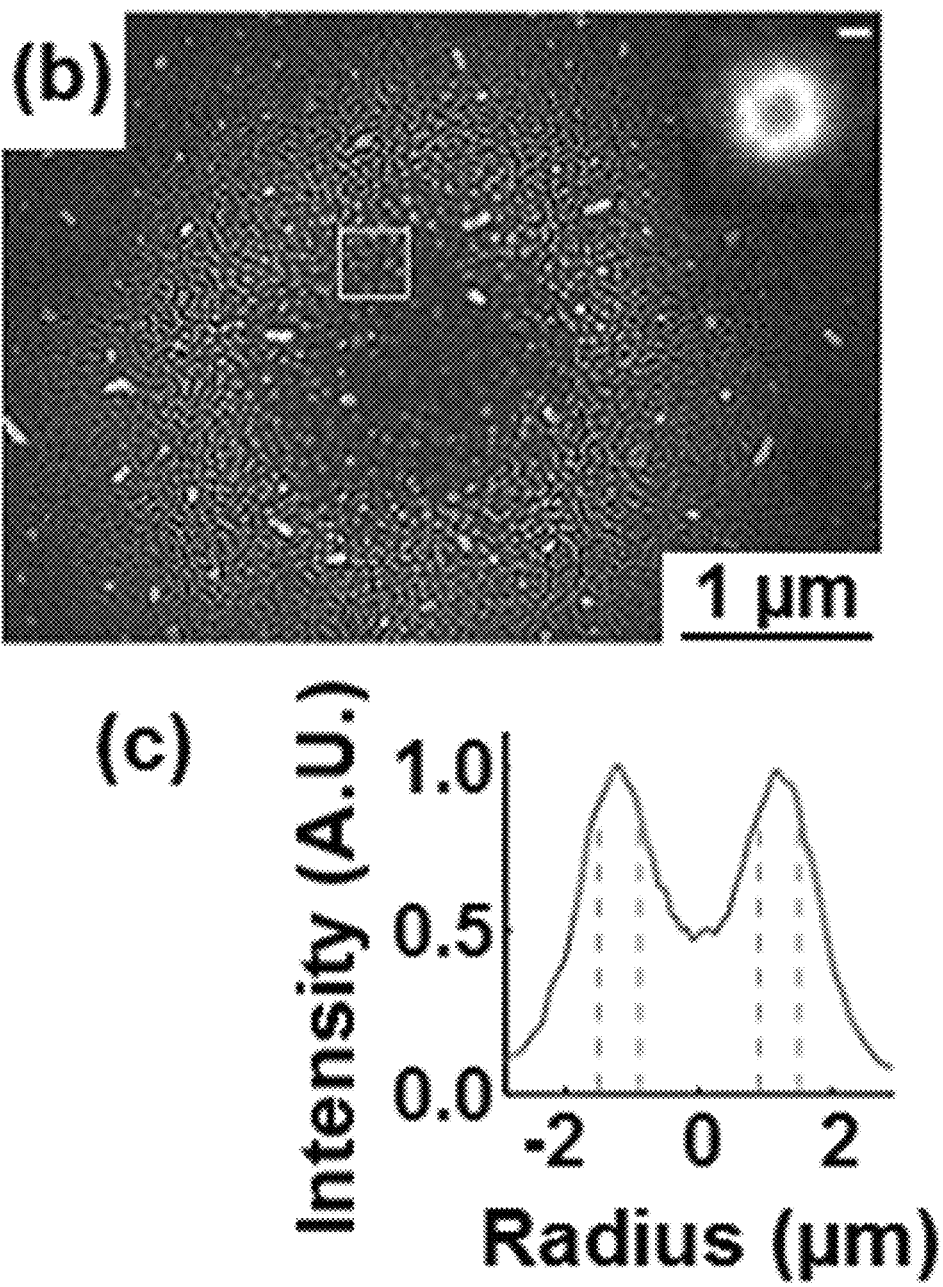
FIG. 2b depicts a donut-shaped NPG spot. The size threshold is indicated by red circles. The inset is the bright-field image of the spot. Scale bar is 1 μm.
FIG. 2c depicts a cross-sectional view of the bright-field image.
Figure 2D:
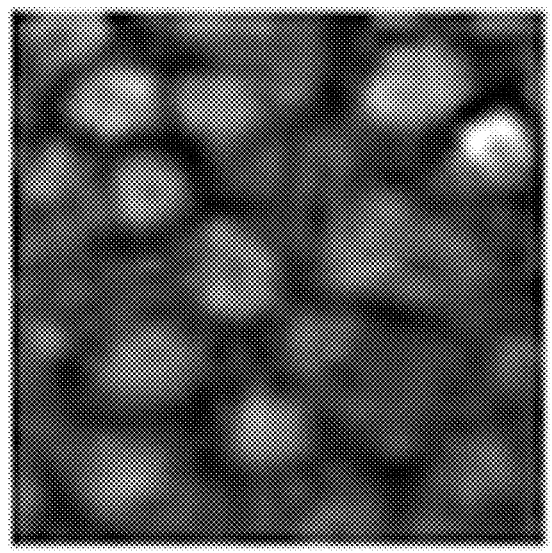
FIG. 2d depicts an enlarged SEM image indicated by the yellow square in FIG. 2b.

The average NPG spot diameter and the corresponding laser irradiation parameters are summarized in FIG. 2a. Empty markers indicate bicontinuous pores and ligaments, and solid markers indicate non-continuous structure at the center. In general, longer irradiation time and higher laser power result in larger NPG spots. Below a certain threshold (~2 mW), dealloying did not occur within 60 s. The pore size increases with increasing laser power, but is interrupted when the power is higher than 5.6 mW when gas bubbles start to appear. In order to achieve bicontinuous pore and ligament structure as shown in FIG. 1, the temperature should be high enough to elevate the dealloying rate but low enough to prevent the bicontinuous nanoporous structure from being annealed and coalesces. In particular, for powers higher than 4.9 mW, the bright-field image appears to be in a donut shape. At the center of the donut, the connectivity of pores and ligaments decreased due to more diffusion of the Au atoms. The transmission is not as high as the areas with higher connectivity. The SEM image of such a NPG spot generated with 4.9 mW for 5 s is shown in FIG. 2b. The bright-field cross-section profile is shown in FIG. 2c in accordance with the red circles indicating the boundaries in FIG. 1b. The enlarged SEM image of the highlighted area in FIG. 2b is shown in FIG. 2d. The ligaments are highly non-continuous and the sizes are ~50 nm. The larger ligament and pore sizes are due to further diffusion of the Au atoms, while the decrease in transmission owing to lower light coupling efficiency due to the change in the material's local plasmonic properties.

The pore size distribution can be fitted with a Gaussian curve $d_i(x)=f(T_i)e^{-x^2/B}$, where $f(T_i)$ is a function of temperature distribution $T_i$ specific to each pair of power and time, and $B=2\sigma^2$ is a constant dependent on the laser beam profile. The diameter D is defined as twice the distance x between the irradiated center and the boundary of the same pore size $d_i(x)=d_0$, thus $D_i=2[-B \ln(d_0/f(T_i))]^{-1/2}$. To simplify the model by assuming the temperature reached steady state within 5 sec and assuming $f(T_i)$ is linear to power P, the curves in FIG. 2a could be fitted with the form of $D=[C_1 \ln(C_2/P)]^{-1/2}$ where $C_1$ and $C_2$ are constants. However, the fitting is no longer valid with power higher than 4.2 mW. The heat transfer can be described as $mc\ d\Delta T/dt=\dot{Q}-\dot{Q}_{ext}$ where m is mass, c is heat capacity, $\Delta T=T-T_{amb}$ is temperature difference, $\dot{Q}=P\eta$ is the heat flow rate as the input power P multiplied by the conversion efficiency $\eta$, and $\dot{Q}_{ext}=KA\Delta T$ is the heat conduction to the ambient where K is the heat transfer coefficient and A is the surface area. The solution to the differential equation has the form $T(t)=T_{amb}-Ce^{-Bt}$, where the temperature would reach a plateau and decrease the lateral expansion rate of the dealloying process, in contrast to the diameter-power curves. The inconsistency is caused by the fact that the photothermal conversion efficiency $\eta$ is not constant during the dealloying, but a dynamic parameter increased by the forming of plasmonic nanoporous structures.

Figures 2E, 2F, 2G, 2H:
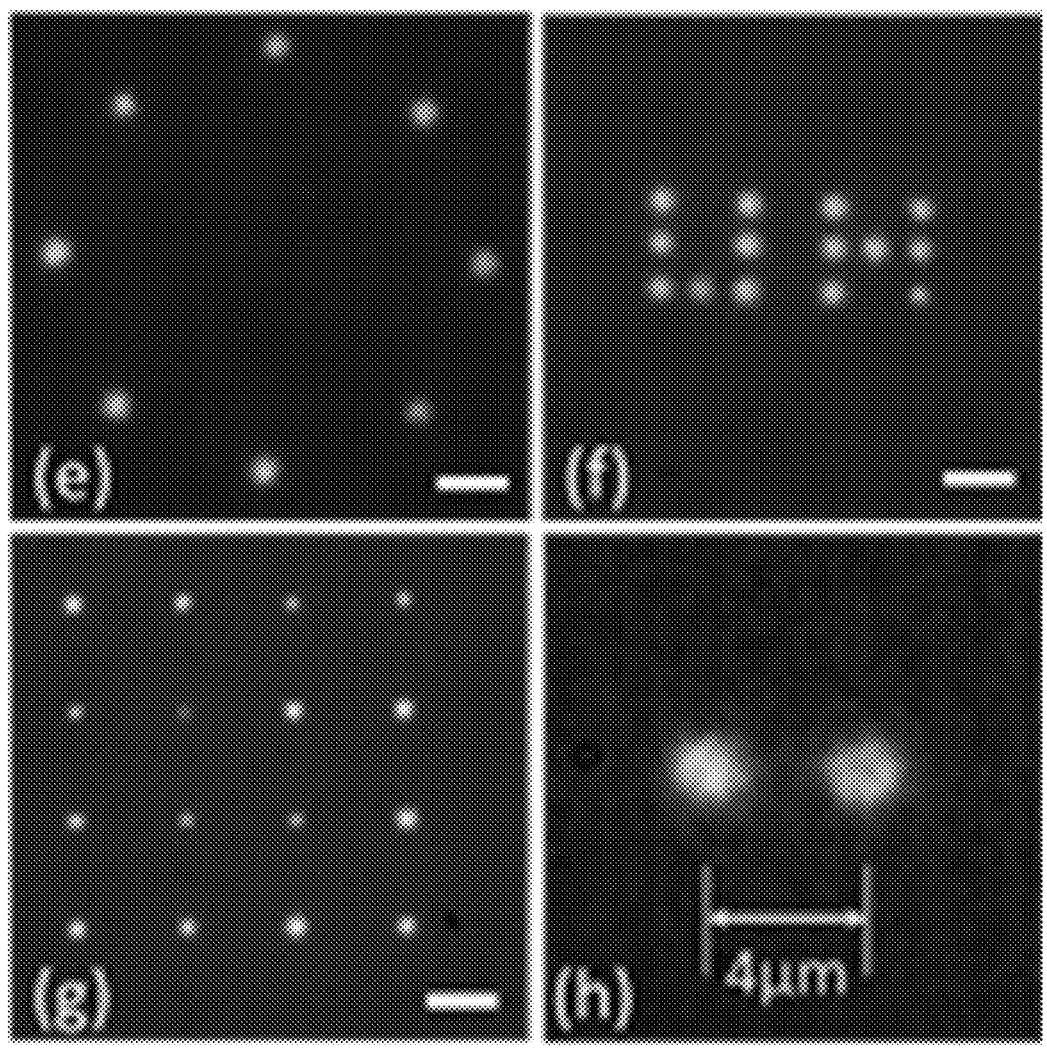
FIG. 2e depicts bright-field images of NPG microstructures of 8 points with equal spacing and equal distance (30 μm) to the center, scale bar (10 μm)
FIG. 2f depicts bright-field images of NPG microstructures of "UH" pattern, each letter is 12 μm×12 μm in size.
FIG. 2g depicts bright-field images of NPG microstructures of a 4 by 4 grid pattern with 20 μm inter-spot spacing.
FIG. 2h depicts bright-field images of NPG microstructures of two adjacent NPG spots.

The patterning function has been employed to generate a variety of NPG microstructures. FIG. 2e-h shows the light transmission images of the dealloyed samples using three different laser patterns. The minimum distance between two adjacent spots to be distinguishable is ~4 µm (FIG. 2h). Shorter distance would result in merged NPG spots due to heat accumulation in unirradiated areas, even though the minimum distance did not reach the spatial resolution of our projection system. An alternative method to continuous irradiation is by high-speed scanning (>250 Hz) which can reduce the minimum distance to ~2 µm. In principle, the patterning distance can be reduced if a more effective heat removal scheme is employed, e.g., by circulating the nearby fluids or a substrate with better heat conduction.

Figure 3A:
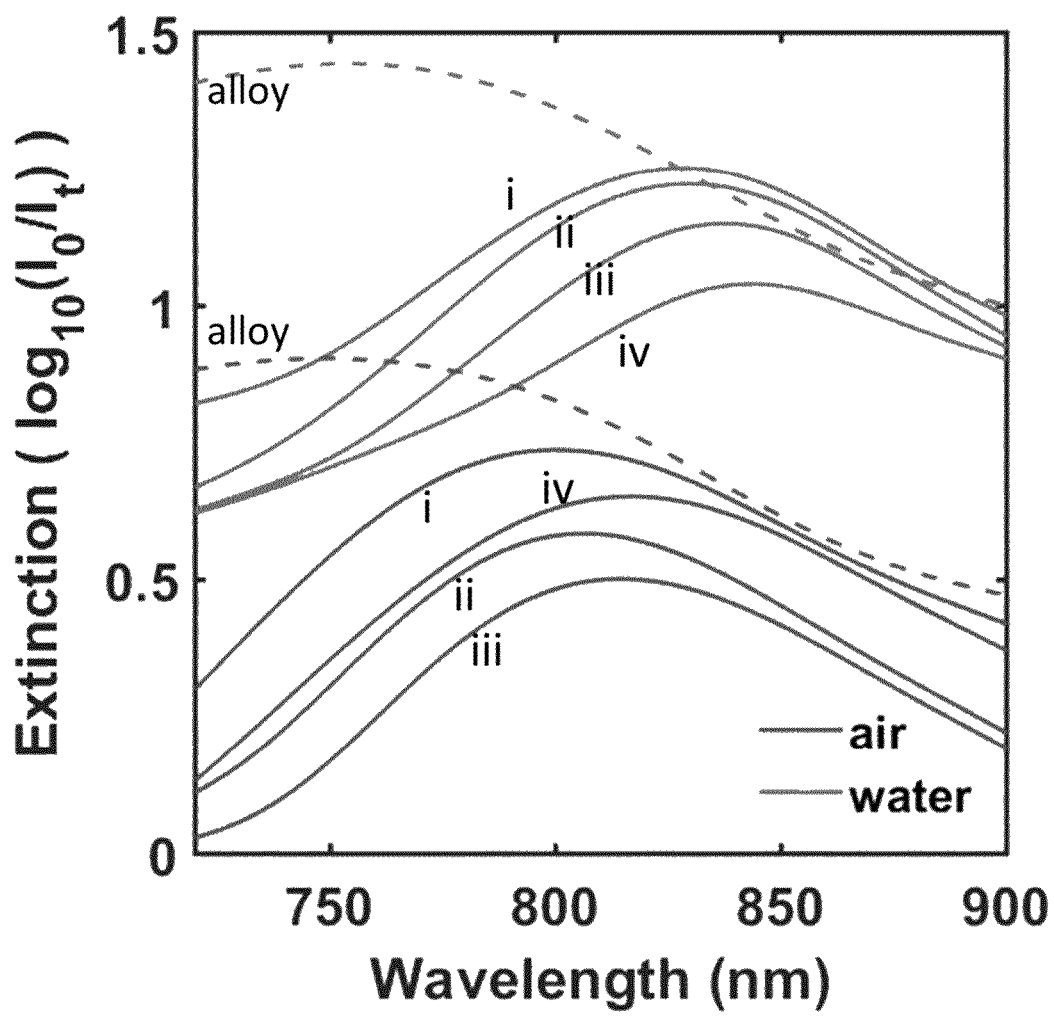
FIG. 3a depicts extinction spectra of alloy (dotted lines) and NPG spots (solid lines) of different diameters and in different media.
Figure 3B:
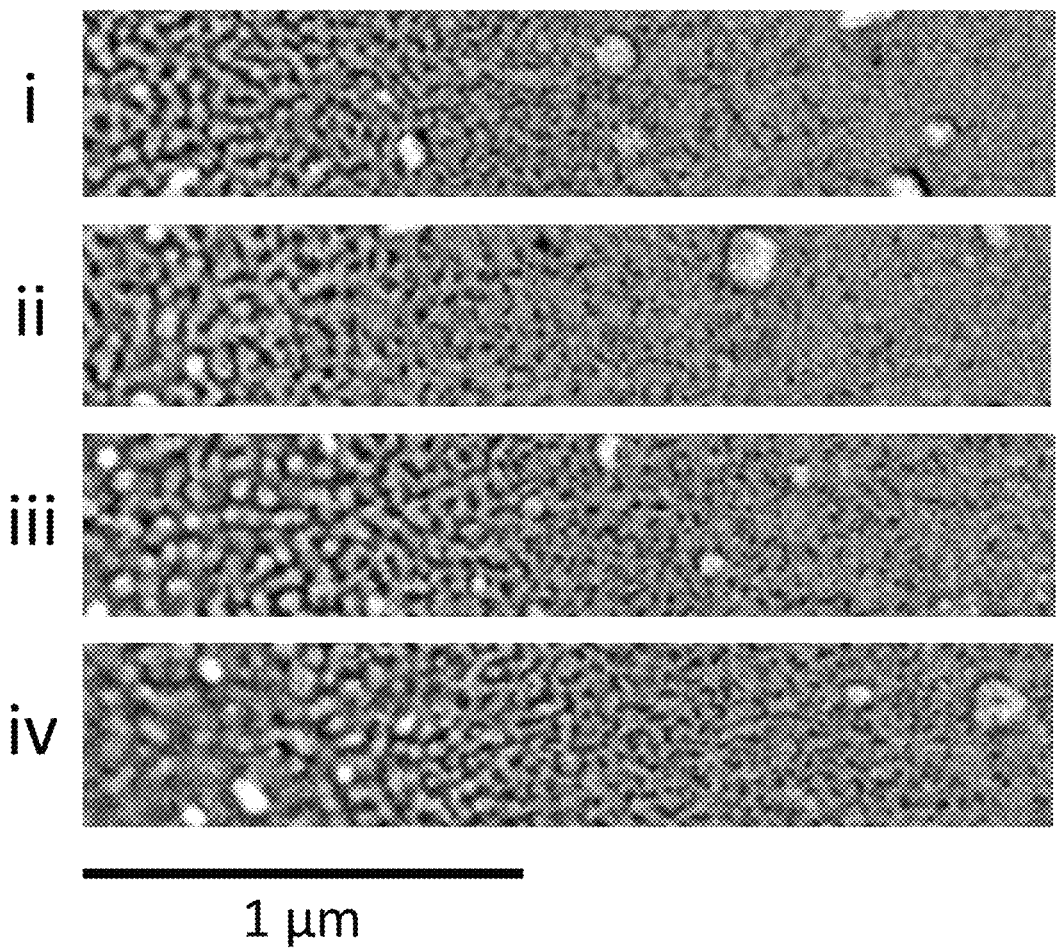
FIG. 3b depicts SEM images of corresponding NPG spots. Scale bar: 1 μm.

The light transmission of the NPG microstructures was characterized. The extinction is calculated as $\log_{10}(I_0/I_t)$ where $I_0$ and $I_t$ refer to the spectra of the light incident on the sample and the spectrum of light transmitted by the sample, respectively. The extinction spectra of the unpatterned alloy and NPG microstructure in both air and DI water are shown in FIG. 3a on a normalized scale. The dotted lines correspond to the alloy film, and solid lines correspond NPG spots of diameters 1, 1.2, 1.5 and 1.8 µm. The corresponding SEM images are shown in FIG. 3b (i) to (iv), where the left ends of the SEM images are aligned with the center of each NPG spot. The extinction spectra of the alloy is broad and does not exhibit clearly defined features. In contrast, the extinction spectra of NPG microstructures manifest a well-defined plasmonic peak near 800 nm in the air, and the peak red-shifts as the spot diameter increases. In addition, the NPG LSPR peak red-shifted in water. Such index-dependent shift was not observed from the alloy film. Among various NPG spots the largest shift was 36.4 nm, and the corresponding index sensitivity was 110.4 nm/RIU. Larger index-induced shifts were observed from a NPG microstructure of a larger diameter.

The evolution of nanoporous structure can be monitored using the bright-field intensity change. There is an average of 6.5 times increase when the NPG microstructures are formed compared to the original alloy film. Therefore, transmission light intensity can be employed to monitor the formation of NPG microstructures in situ. The light transmission intensity can also be an indicator of local refractive index changes. There is a 3.5-fold increase when the environment was changed from air to water. This feature could further contribute to index sensing.

All of the compositions and methods disclosed and claimed herein can be made and executed without undue experimentation in light of the present disclosure. While the compositions and methods of this disclosure have been described in terms of preferred embodiments, it will be apparent to those of skill in the art that variations may be applied to the compositions and methods and in the steps or in the sequence of steps of the methods described herein without departing from the concept, spirit and scope of the disclosure. More specifically, it will be apparent that certain agents which are both chemically related may be substituted for the agents described herein while the same or similar results would be achieved. All such similar substitutes and modifications apparent to those skilled in the art are deemed to be within the spirit, scope and concept of the disclosure as defined by the appended claims.

REFERENCES

1. L. Zhang, H. Chang, A. Hirata, H. Wu, Q. K. Xue, and M. Chen, "Nanoporous gold based optical sensor for sub-ppt detection of mercury ions," ACS nano 7, 4595-4600 (2013).
2. H. Qiu, L. Xue, G. Ji, G. Zhou, X. Huang, Y. Qu, and P. Gao, "Enzyme-modified nanoporous gold-based electrochemical biosensors," Biosensors & bioelectronics 24, 3014-3018 (2009).
3. J. Qi, P. Motwani, M. Gheewala, C. Brennan, J. C. Wolfe, and W. C. Shih, "Surface-enhanced Raman spectroscopy with monolithic nanoporous gold disk substrates," Nanoscale 5, 4105-4109 (2013).
4. T. Fujita, P. Guan, K. McKenna, X. Lang, A. Hirata, L. Zhang, T. Tokunaga, S. Arai, Y. Yamamoto, N. Tanaka, Y. Ishikawa, N. Asao, Y. Yamamoto, J. Erlebacher, and M. Chen, "Atomic origins of the high catalytic activity of nanoporous gold," Nat Mater 11, 775-780 (2012).
5. A. Wittstock, V. Zielasek, J. Biener, C. M. Friend, and M. Baumer, "Nanoporous gold catalysts for selective gas-phase oxidative coupling of methanol at low temperature," Science 327, 319-322 (2010).
6. E. Seker, M. L. Reed, and M. R. Begley, "Nanoporous Gold: Fabrication. Characterization, and Applications," Materials 2, 2188-2215 (2009).
7. C. A. Chapman, S. Ly, L. Wang, E. Seker, and M. J. Matthews, "Utilizing dynamic laser speckle to probe nanoscale morphology evolution in nanoporous gold thin films," Optics express 24, 5323-5333 (2016).
8. L. Zhang, X. Lang, A. Hirata, and M. Chen, "Wrinkled nanoporous gold films with ultrahigh surface-enhanced Raman scattering enhancement," ACS nano 5, 4407-4413 (2011).
9. Y. Jiao, J. D. Ryckman, P. N. Ciesielski, C. A. Escobar, G. K. Jennings, and S. M. Weiss, "Patterned nanoporous gold as an effective SERS template," Nanotechnology 22, 295302 (2011).
10. F. Zhao, J. Zeng, M. M. Parvez Arnob, P. Sun, J. Qi, P. Motwani, M. Gheewala, C. H. Li, A. Paterson, U. Strych, B. Raja, R. C. Willson, J. C. Wolfe, T. R. Lee, and W. C. Shih, "Monolithic NPG nanoparticles with large surface area, tunable plasmonics, and high-density internal hotspots," Nanoscale 6, 8199-8207 (2014).
11. G. M. Santos, F. Zhao, J. Zeng, and W. C. Shih, "Characterization of nanoporous gold disks for photothermal light harvesting and light-gated molecular release," Nanoscale 6, 5718-5724 (2014).
12. M. M. Arnob, F. Zhao, J. Zeng, G. M. Santos, M. Li, and W. C. Shih, "Laser rapid thermal annealing enables tunable plasmonics in nanoporous gold nanoparticles," Nanoscale 6, 12470-12475 (2014).
13. J. B. Zeng, F. S. Zhao, M. Li, C. H. Li, T. R. Lee, and W. C. Shih, "Morphological control and plasmonic tuning of nanoporous gold disks by surface modifications," J Mater Chem C 3, 247-252 (2015).
14. G. M. Santos, F. Zhao, J. Zeng, M. Li, and W. C. Shih, "Label-free, zeptomole cancer biomarker detection by surface-enhanced fluorescence on nanoporous gold disk plasmonic nanoparticles," J Biophotonics 8, 855-863 (2015).
15. G. M. Santos, F. I. Ferrara, F. Zhao, D. F. Rodrigues, and W. C. Shih, "Photothermal inactivation of heat-resistant bacteria on nanoporous gold disk arrays, Opt Mater Express 6, 1217-1229 (2016).
16. F. S. Zhao, J. B. Zeng, G. M. Santos, and W. C. Shih, "In situ patterning of hierarchical nanoporous gold structures by in-plane dealloying," Mater Sci Eng B 194, 34-40 (2015).
17. L. H. Qian, and M. W. Chen, "Ultrafine nanoporous gold by low-temperature dealloying and kinetics of nanopore formation," Appl Phys Lett 91, 083105 (2007).
18. L. Y. Chen, J. S. Yu, T. Fujita, and M. W. Chen, "Nanoporous Copper with Tunable Nanoporosity for SERS Applications," Adv Funct Mater 19, 1221-1226 (2009).
19. N. J. Jenness, R. T. Hill, A. Hucknall, A. Chilkoti, and R. L. Clark, "A versatile diffractive maskless lithography for single-shot and serial microfabrication," Optics express 18, 11754-11762 (2010).
20. J. H. Slater, J. S. Miller, S. S. Yu, and J. L. West, "Fabrication of Multifaceted Micropatterned Surfaces with Laser Scanning Lithography," Advanced Functional Materials 21, 2876-2888 (2011).
21. J. Erlebacher, "An atomistic description of dealloying—Porosity evolution, the critical potential, and rate-limiting behavior," Journal of the Electrochemical Society 151, C614-C626 (2004).
22. Y.-C. K. Chen-Wiegart, S. Wang, I. McNulty, and D. C. Dunand, "Effect of Ag—Au composition and acid concentration on dealloying front velocity and cracking during nanoporous gold formation," Acta Materialia 61, 5561-5570 (2013).
23. N. J. Jenness, K. D. Wulff, M. S. Johannes, M. J. Padgett, D. G. Cole, and R. L. Clark, "Three-dimensional parallel holographic micropatterning using a spatial light modulator," Optics express 16, 15942-15948 (2008).
24. J. Qi, and W. C. Shih, "Parallel Raman microspectroscopy using programmable multipoint illumination," Optics letters 37, 1289-1291 (2012).
25. J. Qi, J. Li, and W. C. Shih, "High-speed hyperspectral Raman imaging for label-free compositional microanalysis," Biomed Opt Express 4, 2376-2382 (2013).

What is claimed is:

1. A method for forming a nanoporous metal, comprising:
providing a substrate;
evaporating chromium onto the substrate to form a chromium layer;
evaporating gold onto the chromium layer to form a gold adhesion layer;
sputtering a layer of a noble metal alloy on the gold to form a sample;
immersing the sample in an acid solution;
placing the sample in the acid solution on a microscope; and
irradiating a projected laser pattern on the alloy layer.

2. The method of claim 1 wherein the irradiating occurs for 5 to 20 seconds.

3. The method of claim 1 further comprising
performing a phase modulation and producing a desired pattern using a continuous wave laser beam incident on a spatial light modulator, wherein a modulated beam is fed through a back port of an inverted microscope to form a laser pattern.

4. The method of claim 1 wherein the noble metal alloy is comprised of a first noble metal and a second noble metal selected from the group consisting of ruthenium, rhodium, palladium, silver, osmium, iridium, platinum, gold, mercury, rhenium, and copper, wherein the first noble metal and the second noble metal are not the same noble metal.

5. The method of claim 1 wherein the noble metal alloy is comprised of gold and silver.

6. The method of claim 1 wherein the acid in the acid solution is nitric acid.

7. The method of claim 1 wherein the concentration of acid in the acid solution is equal or less than 3.65 M.

8. The method of claim 1 wherein the thickness of the chromium layer is 2-5 nm.

9. The method of claim 1 wherein the thickness of the gold adhesion layer is 5-50 nm.

10. The method of claim 1 wherein the thickness of the alloy layer is 20-100 nm.

11. The method of claim 1 wherein the substrate is made of one selected from the group consisting of glass, plastics, optical fiber, and a combination thereof.

12. The method of claim 1 wherein the substrate is selected from the group consisting of curved, microscopic, non-rigid, and a combination thereof.

13. The method of claim 1 wherein the substrate is selected from the group consisting of medical catheter, medical implant, capillary tube, and contact lenses.

14. The method of claim 1 wherein the nanoporous metal is a nanoporous gold microstructure.

15. The method of claim 14 wherein the nanoporous metal is utilized in a microfluidic device.

16. The method of claim 15 wherein the microfluidic device is a biosensor or photothermal activators.

17. The method of claim 16 wherein the nanoporous gold microstructure occurs after a bonding step of the microfluidic device.

* * * * *

UNITED STATES PATENT AND TRADEMARK OFFICE
CERTIFICATE OF CORRECTION

PATENT NO. : 10,822,689 B2
APPLICATION NO. : 16/333695
DATED : November 3, 2020
INVENTOR(S) : Wei-Chuan Shih et al.

Page 1 of 1

It is certified that error appears in the above-identified patent and that said Letters Patent is hereby corrected as shown below:

In the Specification
1. In Column 7, Line 39, delete "Di=2[-B ln" and insert -- Di=2[-Bln --, therefor.
2. In Column 7, Line 42, delete "D=[C1 ln" and insert -- Dj=2[-Bln --, therefor.
3. In Column 8, Line 3, delete "ifa" and insert -- if a --, therefor.
4. In Column 9, Line 13, delete "Fabrication." and insert -- Fabrication, --, therefor.

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*